US009252765B2

United States Patent
Terzioglu et al.

(10) Patent No.: US 9,252,765 B2
(45) Date of Patent: *Feb. 2, 2016

(54) N-WELL SWITCHING CIRCUIT

(71) Applicant: QUALCOMM Incorporated, San Diego, CA (US)

(72) Inventors: Esin Terzioglu, San Diego, CA (US); Gregory Ameriada Uvieghara, Murrieta, CA (US); Sei Seung Yoon, San Diego, CA (US); Balachander Ganesan, Mountain View, CA (US); Anil Chowdary Kota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/472,953

(22) Filed: Aug. 29, 2014

(65) Prior Publication Data

US 2014/0369152 A1    Dec. 18, 2014

Related U.S. Application Data

(63) Continuation of application No. PCT/US2014/011138, filed on Jan. 10, 2014, which is a continuation of application No. 13/742,964, filed on Jan. 16, 2013, now Pat. No. 8,787,096.

(51) Int. Cl.
*G11C 8/08* (2006.01)
*H03K 17/22* (2006.01)
(Continued)

(52) U.S. Cl.
CPC ............. *H03K 17/223* (2013.01); *G11C 7/00* (2013.01); *G11C 7/12* (2013.01); *G11C 8/08* (2013.01);
(Continued)

(58) Field of Classification Search
CPC .......... G11C 7/00; G11C 13/0069; G11C 8/08
USPC ............................ 365/189.05, 185.24, 230.06
See application file for complete search history.

(56) References Cited

U.S. PATENT DOCUMENTS 4,670,668 A    6/1987   Liu
5,844,425 A    12/1998  Nguyen et al.
(Continued)

FOREIGN PATENT DOCUMENTS

CN    101997305 A    3/2011
EP    1832951 A2     9/2007
EP    1840965 A2     10/2007

OTHER PUBLICATIONS

"Circuit Scheme to Bias OCD Output Stage N-Well", IBM Technical Disclosure Bulletin, International Business Machines Corporation (Thornwood), US, vol. 34, No. 11, Apr. 1, 1992, pp. 397-400, XP000303306, ISSN: 0018-8689 the whole document.
(Continued)

*Primary Examiner* — Michael Tran
(74) *Attorney, Agent, or Firm* — Haynes and Boone, LLP

(57) ABSTRACT

A dual-mode PMOS transistor is disclosed that has a first mode of operation in which a switched n-well for the dual-mode PMOS transistor is biased to a high voltage. The dual-mode PMOS transistor has a second mode of operation in which the switched n-well is biased to a low voltage that is lower than the high voltage. The dual-mode PMOS transistor has a size and gate-oxide thickness each having a magnitude that cannot accommodate a permanent tie to the high voltage. An n-well voltage switching circuit biases the switched n-well to prevent voltage damage to the dual-mode PMOS transistor despite its relatively small size and thin gate-oxide thickness.

16 Claims, 4 Drawing Sheets

(51) Int. Cl.
  *G11C 7/12* (2006.01)
  *G11C 17/18* (2006.01)
  *H03K 17/081* (2006.01)
  *H03K 19/003* (2006.01)
  *G11C 7/00* (2006.01)
  *H03K 17/687* (2006.01)
  *G11C 13/00* (2006.01)

(52) U.S. Cl.
  CPC .......... *G11C 17/18* (2013.01); *H03K 17/08104* (2013.01); *H03K 17/6872* (2013.01); *H03K 19/00315* (2013.01); *G11C 13/0069* (2013.01); *H03K 2217/0018* (2013.01); *H03K 2217/0063* (2013.01); *H03K 2217/0072* (2013.01)

(56) References Cited

U.S. PATENT DOCUMENTS

| | | | |
|---|---|---|---|
| 5,942,784 | A | 8/1999 | Harima et al. |
| 6,377,112 | B1 | 4/2002 | Rozsypal |
| 6,452,858 | B1 | 9/2002 | Hanzawa et al. |
| 7,038,274 | B2 * | 5/2006 | You et al. .................... 257/335 |
| 8,787,096 | B1 | 7/2014 | Terzioglu et al. |
| 2002/0140036 | A1 * | 10/2002 | Ma et al. .................... 257/351 |
| 2003/0205767 | A1 * | 11/2003 | Ma et al. .................... 257/371 |
| 2005/0068069 | A1 | 3/2005 | Chen et al. |
| 2005/0106828 | A1 * | 5/2005 | You et al. .................... 438/305 |
| 2005/0128670 | A1 | 6/2005 | Chen et al. |
| 2005/0200401 | A1 | 9/2005 | Jang et al. |
| 2009/0261865 | A1 | 10/2009 | Pasqualini |
| 2010/0193878 | A1 | 8/2010 | Cai |

OTHER PUBLICATIONS

International Search Report and Written Opinion—PCT/US2014/011138—ISA/EPO—May 16, 2014.

"Performance-Controlled CMOS Driver for Multi-Voltage Interfaces", IBM Technical Disclosure Bulletin, International Business Machines Corporation (Thornwood), US, vol. 33, No. 3A, Aug. 1, 1990, p. 445-446, XP000120541, ISSN: 0018-8689 the whole document.

* cited by examiner

N-WELL SWITCHING CIRCUIT

RELATED APPLICATIONS

This application is a continuation of International Application No. PCT/US2014/011138, filed Jan. 10, 2014, which in turn claims priority to U.S. application Ser. No. 13/742,964, filed Jan. 16, 2013, now issued as U.S. Pat. No. 8,787,096.

TECHNICAL FIELD

This application relates to integrated circuits, and more particularly to an n-well biasing scheme to prevent latchup for high-density applications.

BACKGROUND

A PMOS transistor includes a p-type drain and source formed in an n-type body. Holes are thus the majority carrier in a PMOS channel. In complementary MOS (CMOS) technology, the bulk substrate is p-type such that the n-type body for a PMOS transistor exists as an n-type well (n-well) in the p-type substrate.

Because holes are the majority carrier in a PMOS transistor, the PMOS source will be at a positive voltage with regard to the drain when the channel is conducting. This positive voltage on the source can be problematic in that a p-n junction is formed between the source and the n-well for the PMOS transistor. If the source is sufficiently biased with regard to the n-well, that p-n junction is then forward biased. A conducting parasitic structure results from this forward biased p-n junction and the ground connection to NMOS transistors in the p-type substrate. The resulting short circuit condition in the conducting parasitic structure is referred to as latchup. Latchup is dangerous in that the circuit can be destroyed from the latchup currents. Moreover, even if the circuit can withstand the short circuit currents, latchup inhibits normal operation.

To prevent latchup, it is conventional to tie a PMOS transistor's n-well to the highest expected voltage. For example, if a PMOS transistor can operate in a low-voltage mode and also in a high-voltage mode, it is conventional to tie the PMOS n-well to the high-voltage supply used during the high-voltage mode operation. But the n-well tie is problematic as transistor dimensions are reduced such as in deep sub-micron technology. At these modern process nodes, the gate oxide is too thin and the transistor is too small to handle the stress resulting from tying the n-well to a relatively high-voltage supply.

To solve the latchup problem for PMOS transistors in modern process nodes that can operate in both high and low voltage modes, it is conventional to use robust PMOS transistors. In other words, the transistor dimensions are increased and a relatively thick gate oxide is used. Such a large thick-gate oxide PMOS transistor can then have its n-well tied to the high-voltage supply without stressing the transistor. But the large transistor dimensions demand a lot of die area relative to the smaller transistor dimensions used in modern process nodes.

Accordingly, there is a need in the art for latchup prevention architectures with increased density.

SUMMARY

An n-well voltage switching circuit controls the voltage for a switched n-well of a dual-mode PMOS transistor to prevent latchup. The dual-mode PMOS transistor is controlled to operate in both a high-voltage mode and a low-voltage mode. In the high-voltage mode, the n-well voltage switching circuit biases the switched n-well to a high voltage. This high voltage is at least as high as any expected source (or drain) voltage for the dual-mode PMOS transistor during operation in the high-voltage mode. In this fashion, the p-n junction for the dual-mode PMOS transistor between its source and the switched n-well does not get forward biased and latchup is prevented accordingly.

During the low-voltage mode of operation, the n-well voltage switching circuit biases the switched n-well to a low voltage that is lower than the high voltage. This low voltage is sufficiently low such that the dual-mode PMOS transistor is not strained during the low-voltage mode. In this fashion, the dual-mode PMOS transistor may be relatively small and have a thin-gate oxide to enhance density. A plurality of dual-mode PMOS transistors may have the voltage of their switched n-wells biased by the n-well voltage switching circuit to further enhance density.

The n-well switching voltage switching circuit includes a first PMOS transistor of a first size having a first gate-oxide thickness. The first size and the first gate-oxide thickness have a magnitude such that a permanent coupling of an unswitched n-well and a source for the first PMOS transistor to a high-voltage supply providing the high voltage does not cause damage to the first PMOS transistor. In contrast, the dual-mode PMOS transistor has a second size that is less than the first size and a second gate-oxide thickness that is less than the first gate-oxide thickness. The second size and the second gate-oxide thickness have a magnitude such that the switched n-well for the dual-mode PMOS transistor cannot be permanently coupled to the high-voltage supply without incurring damage to the dual-mode PMOS transistor. To prevent such damage, the n-well voltage switching circuit is controlled so that the switched n-well is biased to the high voltage for no longer than a safe duration that protects the dual-mode PMOS transistor from damage despite its relatively small size and thin gate-oxide thickness.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To address the need in the art for latchup prevention architectures with increased density, an n-well voltage switching circuit is disclosed that controls the voltage bias for a dual-mode PMOS transistor's switched n-well. In a low-power mode of operation, the n-well voltage switching circuit biases the switched n-well to a relatively low voltage. Conversely, in a high-power mode of operation, the n-well voltage switching circuit biases the switched n-well to a relatively high voltage. What constitutes low and high voltage for the embodiments discussed herein depends upon the process node. For example, in a 20 nm process node, the high voltage may be 1.9 V whereas the low voltage may be 1 V. More generally, the high voltage has a magnitude that is too high for the switched n-well to be continuously biased to the high voltage without incurring damage to PMOS transistors within the n-well. In contrast, the low voltage is safe for a prolonged biasing of the switched n-well. What is safe versus what is not safe will depend on the particular process node being used.

Figure 1:
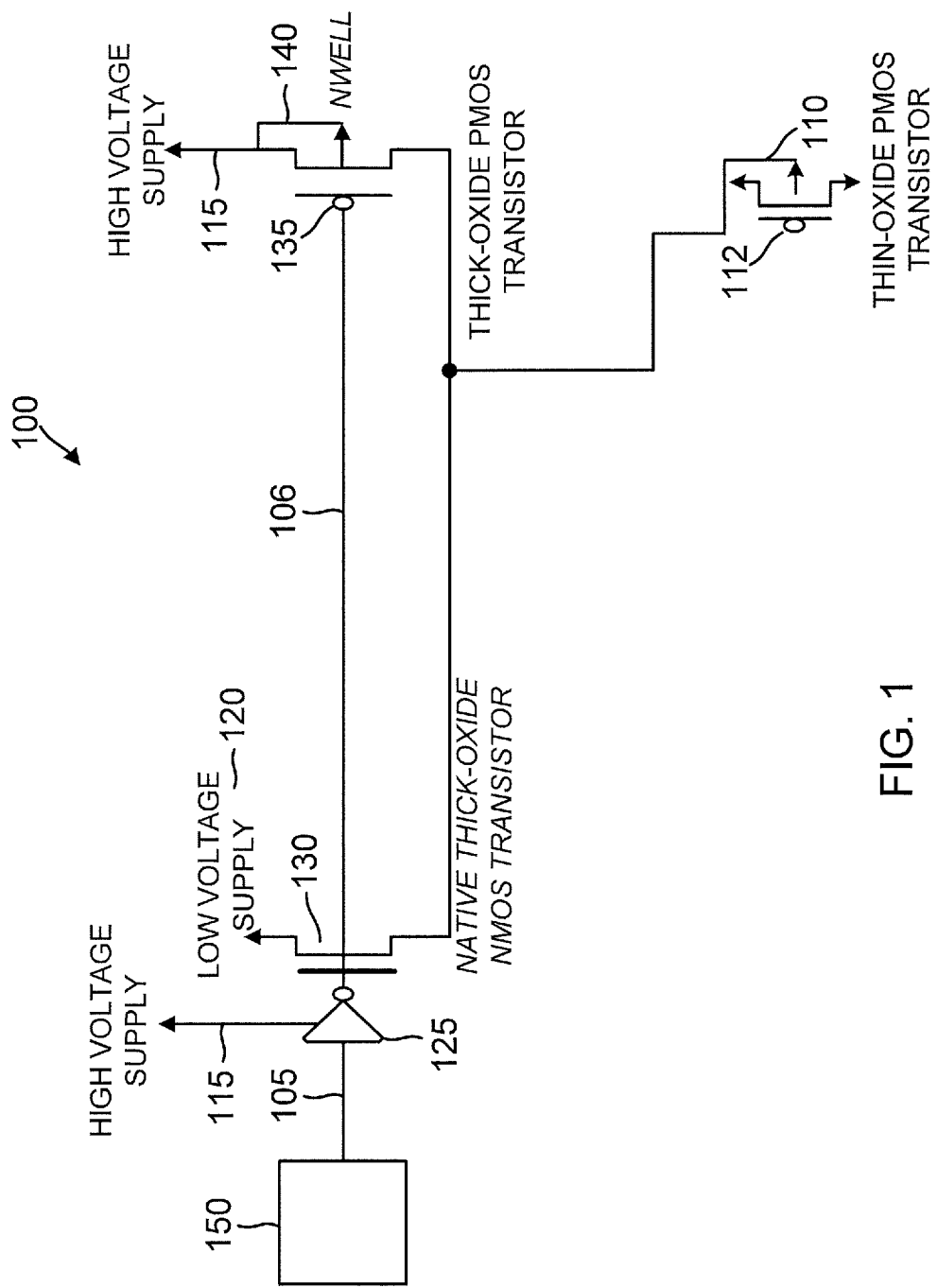
FIG. 1 is a schematic diagram for an n-well voltage switching circuit.

Turning now to the drawings, FIG. 1 shows an embodiment of an n-well voltage switching circuit 100 that is responsive to a mode control signal 105. If mode control signal 105 is asserted high (to indicate high-voltage mode operation), n-well voltage switching circuit 100 charges a switched n-well 110 for a dual-mode PMOS transistor 112 to a high voltage during a high-voltage (or power) mode of operation for dual-mode PMOS transistor 112. On the other hand, if mode control signal 105 is pulled low to select for a low-voltage mode of operation for dual-mode PMOS transistor 112, n-well voltage switching circuit 100 biases switched n-well 110 to a low voltage. In this fashion, switched n-well 110 need not be permanently tied to a high-voltage supply. As discussed further herein, dual-mode PMOS transistor 112 can then take advantage of the smaller dimensions (and thinner oxide) available in modern process nodes.

An inverter 125 inverts mode control signal 105 into an inverted control signal 106. Inverted control signal 106 drives the gate of a native thick-oxide NMOS transistor 130. A drain of native thick-oxide NMOS transistor 130 is tied to a low voltage supply 120 whereas its source is tied to switched n-well 110. Low voltage supply 120 supplies the low voltage for switched n-well 110 when NMOS transistor 130 is turned on. Thus, when mode control signal 105 goes low to select for a low-voltage mode of operation for dual-mode PMOS transistor 112, inverted control signal 106 goes high such that NMOS transistor 130 turns fully on to bias switched n-well 110 to the low voltage. The source for NMOS transistor 130 forms part of an output node for n-well switching circuit 100 that couples to switched n-well 110. Inverted control signal 106 also drives the gate of a thick-oxide PMOS transistor 135, which is thus off in the low-voltage mode. The source of PMOS transistor 135 is tied to a high-voltage supply 115 and its drain is tied to switched n-well 110.

To select for a high-voltage mode of operation, mode control signal 105 is asserted high such that inverter 125 pulls inverted control signal 106 low so that PMOS transistor 135 is fully on. The drain of PMOS transistor 135 forms a remaining part of an output node for n-well voltage switching circuit 100 that couples to switched n-well 110. High-voltage supply 115 supplies the high voltage that biases switched n-well 110 when PMOS transistor 135 is turned on. NMOS transistor 130 is turned off in response to inverted control signal 106 going low at this time. Thus, switched n-well 110 for dual-mode PMOS transistor 112 is biased to the high voltage when mode control signal 105 goes high. PMOS transistor 135 is not stressed from the high voltage since its n-well 140 is also tied to high voltage supply 115 and because its gate oxide is relatively thick. In addition, PMOS transistor 135 has a size (channel length) sufficiently large to be robust to such a permanent coupling to the high voltage.

Because the source of PMOS transistor 135 is tied to high voltage supply 115, control signal 106 should also be charged to the high voltage during the low-power mode of operation for dual-mode PMOS transistor 112. If control signal 106 were instead just charged to the low voltage during this time, the gate voltage of PMOS transistor 135 could be sufficiently lower than its source voltage so that PMOS transistor 135 would conduct rather than be shut off. Thus, high-voltage supply 115 supplies the power to inverter 125 so that control signal 106 is charged to the high voltage during the low-voltage mode of operation for dual-mode PMOS transistor 112. In this fashion, PMOS transistor 135 is fully off during the low-power mode of operation. NMOS transistor 130 is a thick-oxide transistor even though its drain is tied only to low-voltage supply 120 because its gate will thus be charged to the high voltage during the low-voltage mode of operation for dual-mode PMOS transistor 112.

Both PMOS transistor 135 and NMOS transistor 130 must be relatively large and robust to withstand the strain from high-voltage supply 115. These transistors thus demand die space accordingly. But there need only be one n-well voltage switching circuit 100 to control the switched n-well potential for assorted other dual-mode PMOS transistors having the low and high voltage modes of operation. In this fashion, substantial die area savings may be realized. Dual-mode transistor PMOS 112 has a size that is smaller than the size used for PMOS transistor 135 and NMOS transistor 130. For example, dual-mode PMOS transistor 112 may have the minimum size and gate oxide thickness allowed by the process node. In this fashion, density is greatly enhanced.

It will be appreciated that inverter 125 may be omitted in alternative embodiments in which control signal 105 is replaced with an active low control signal that would directly drive the gates of NMOS transistor 130 and PMOS transistor 135. In such an embodiment, the active low control signal would be pulled low to select for the high-voltage mode of operation. Conversely, the active low control signal would be charged to the high voltage to select for the low-voltage mode of operation.

Figure 2:
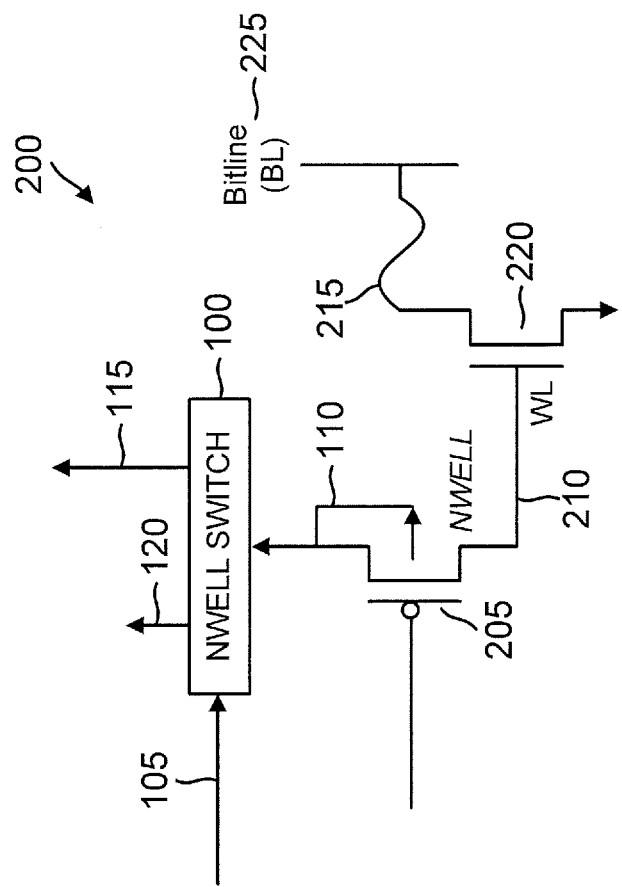
FIG. 2 is a schematic diagram for an electronically programmable memory incorporating the n-well voltage switching circuit of FIG. 1.

Numerous applications may advantageously use relatively small thin-oxide dual-mode PMOS transistors in switched n-wells disclosed herein. For example, an electrically-programmable fuse (e-fuse) memory includes assorted word line drivers as well as programming transistors. In a conventional e-fuse memory, the corresponding transistors for the word line drivers and the associated programming transistors needed to be relatively large and have thick gate oxides to withstand the high voltage used to program the e-fuses. In contrast, an e-fuse memory 200 shown in FIG. 2 enables the use of small thin-oxide word line drivers and programming transistors, which advantageously increases density.

For illustration clarity, e-fuse memory 200 is shown with just a single word line 210 and a single bit line 225. It will be appreciated, however, that e-fuse memory 200 includes a plurality of other word lines and bit lines arranged analogously as shown for word line 210 and bit line 225. The other word lines would form additional rows in parallel with word line 210. Similarly, the other bit lines would form columns in parallel with bit line 225. When a word line is asserted by its word line driver, the corresponding e-fuses for that word line may be either read or programmed depending upon the bias for the bit lines. Each intersection of a word line and the bit lines corresponds to an e-fuse. For example, an e-fuse 215 corresponds to the intersection of word line 210 and bit line 225. Each e-fuse comprises a fusible link that is conductive in the un-programmed state. In contrast, a programmed e-fuse is either an open circuit or much more resistive as compared to an un-programmed e-fuse. To read a given e-fuse, its word line and bit line are both asserted. Since an e-fuse should not be programmed in a read operation, the assertion of the word line and the bit line in a read operation may be performed using the low voltage. In contrast, the word line and bit line are both asserted to the high voltage to program a corresponding e-fuse. Reading the e-fuses would thus correspond to a low-voltage mode of operation whereas programming the e-fuses corresponds to a high-voltage mode of operation.

Given these low and high voltage modes of operation, the word line driver transistors may thus be advantageously implemented using a switched n-well so that these transistors may remain relatively small yet be robust to the high-voltage mode of operation. With regard to e-fuse 215, a small thin-oxide word line (WL) driver PMOS transistor 205 has its drain tied to word line 210. WL driver PMOS transistor 205 has its switched n-well 110 controlled by n-well voltage switching circuit 100 as discussed with regard to FIG. 1. In addition, the source of WL driver PMOS transistor 205 is also tied to switched n-well 110 so that the voltage bias for both the source and switched n-well 110 are controlled by mode control signal 105. Thus, if e-fuse 215 is to be programmed, n-well voltage switching circuit 100 biases the source and switched n-well 110 for WL driver PMOS transistor 205 to the high voltage. A word line decoder (not illustrated) selects for word line 210 by pulling the gate of WL driver PMOS transistor 205 low. In response, WL driver PMOS transistor 205 turns on and biases word line 210 to the high voltage. Word line 210 controls a gate of a small thin-oxide programming NMOS transistor 220 having its source tied to ground and a drain tied to a terminal of e-fuse 215. In the programming mode, programming NMOS transistor 220 thus has its gate biased to the high voltage. Bit line 225 couples to a remaining terminal of e-fuse 215. If bit line 225 is also charged to the high voltage when NMOS programming transistor 220 turns on, a relatively large amount of current will flow through e-fuse 215 so that it can be programmed.

To read the state of e-fuse 215, mode control signal 105 commands n-well voltage switching circuit 100 to bias the source and switched n-well 110 of WL driver PMOS transistor 205 to the low voltage. If the gate of WL driver PMOS transistor 205 is then pulled low, this transistor will then turn on to charge word line 210 to the low voltage so as to turn on NMOS programming transistor 220. During this read operation, bit line 225 is biased to the low-voltage. If e-fuse 215 is un-programmed, the assertion of word line 210 will pull the charged bit line 225 towards ground because of the conduction through NMOS programming transistor 220. In contrast, if e-fuse 215 had been programmed, bit line 225 will not be pulled to ground despite NMOS programming transistor 220 being turned on.

Although WL driver PMOS transistor 205 is thus protected from latchup during the high-voltage mode of operation for programming e-fuses, it is not robust to a sufficiently long period of high-voltage operation since WL driver PMOS transistor 205 is a small thin-oxide transistor. But the programming of an e-fuse takes a relatively short amount of time as compared to the high-voltage longevity of such a small thin-oxide transistor. Referring back to FIG. 1, a controller 150 that controls the state of mode control signal 105 is configured to assert mode control signal 105 only for the relatively short amount of time necessary to program e-fuse 215. In this fashion, both WL driver PMOS transistor 205 and programming NMOS transistor 220 are biased by the high voltage only for the duration necessary to program e-fuse 215. Thus, both of these transistors can take advantage of the small dimensions and thin gate-oxide thickness available in modern process nodes, which greatly enhances die saving. For example, if memory 200 includes a plurality N of word lines and the same plurality N of bit lines, it would include $N^2$ e-fuses and would thus require $N^2$ programming transistors. The die area savings are thus quadratically related to the size of the memory.

Figure 3:
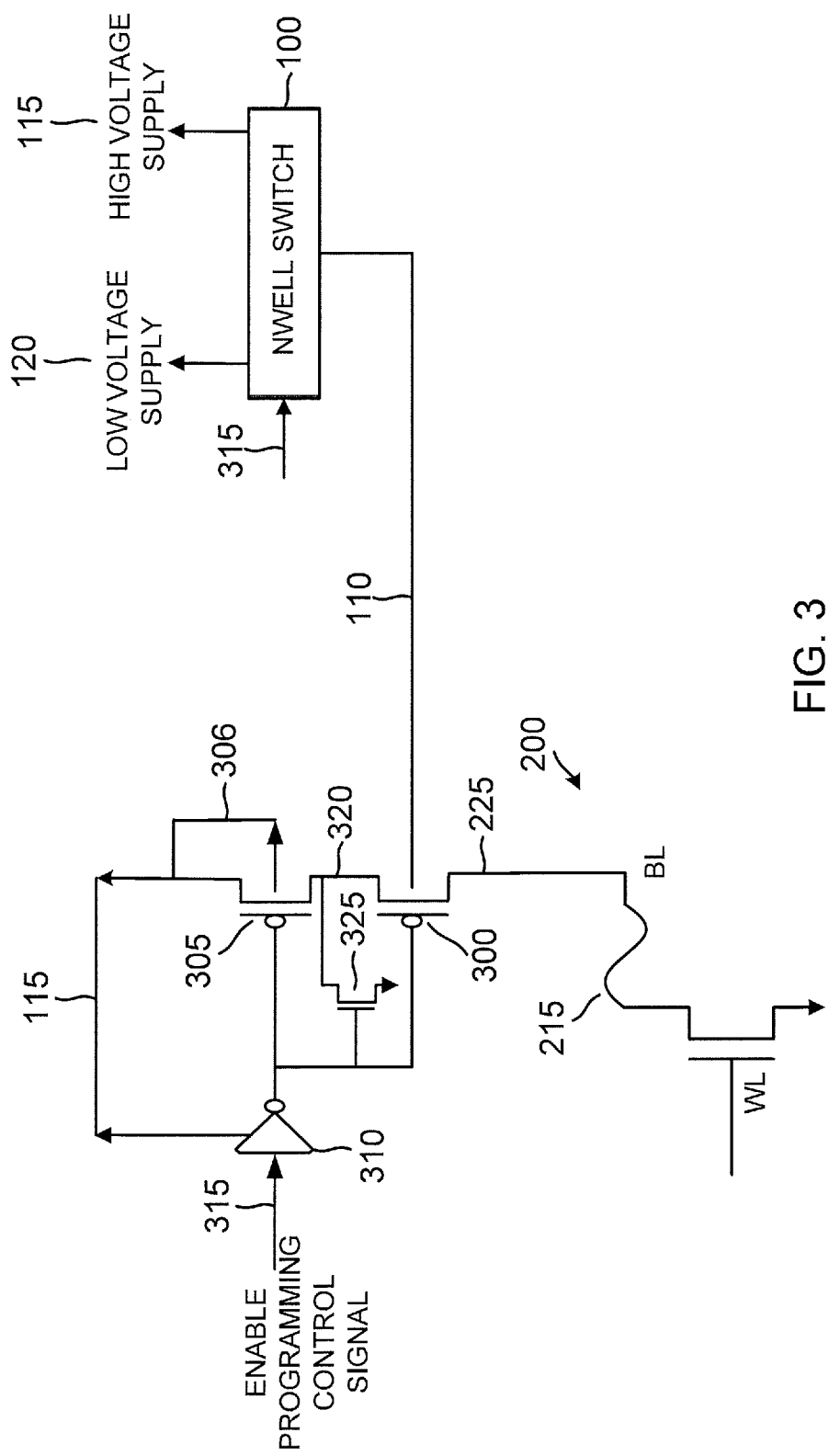
FIG. 3 is a schematic diagram of a high voltage switch for the bit line in the memory of FIG. 2.

The n-well voltage switching discussed herein may also be applied to the power switch used to pull bit line 225 to the high voltage during the programming mode. In that regard, it is advantageous to include a global power switch in series with a local power switch for the high-voltage charging of bit line 225. In a conventional e-fuse memory, both these switches would comprise relatively large thick-oxide PMOS transistors having their n-wells permanently tied to high voltage supply 115 to prevent latchup. But as shown in FIG. 3, a local power switch comprises a relatively small thin-oxide PMOS transistor 300 having its switched n-well 110 controlled by n-well voltage switching circuit 100. A global power switch comprises a relatively large thick-oxide PMOS transistor 305 having its source and an un-switched n-well 306 tied to high-voltage supply 115. PMOS transistor 300 couples in series between bit line 225 and a drain for PMOS transistor 305. An enable programming control signal 315 is inverted through an inverter 310 to drive the gates of both PMOS transistors 305 and 300. Thus, when enable programming control signal 315 is asserted high to select for the programming mode for e-fuse 215, PMOS transistors 305 and 300 are turned on such that bit line 225 is charged to the high voltage from high voltage. In this embodiment, enable programming control signal 315 is also the mode control signal for n-well voltage switching circuit 100. Thus, when enable programming control signal 315 is asserted, switched n-well 110 is also charged to the high voltage.

After e-fuse 215 has been programmed, enable programming control signal 315 is de-asserted such that PMOS transistors 300 and 305 are turned off. At the same time, n-well voltage switching circuit 100 biases switched n-well 110 to the low voltage. But note that a node 320 coupling to the source for PMOS transistor 300 was charged to the high voltage during the programming mode. To prevent any possibility of latchup occurring from this charged node potential as compared to the low voltage for switched n-well 110, an NMOS transistor 325 pulls node 320 to ground when memory 200 is not being programmed. To do so, inverter 310 drives the gate of NMOS transistor 325 such that NMOS transistor 325 turns on in response to the de-assertion of enable programming mode control signal 315. A source of NMOS transistor 325 is tied to ground whereas its drain is tied to node 320. In this fashion, NMOS transistor 325 will pull the potential for node 320 to ground when e-fuse memory 200 is not in the programming mode. A separate low voltage switch (not illustrated) would be active during a read mode of operation for memory 200 to charge bit line 225 to the low voltage.

Figure 4:
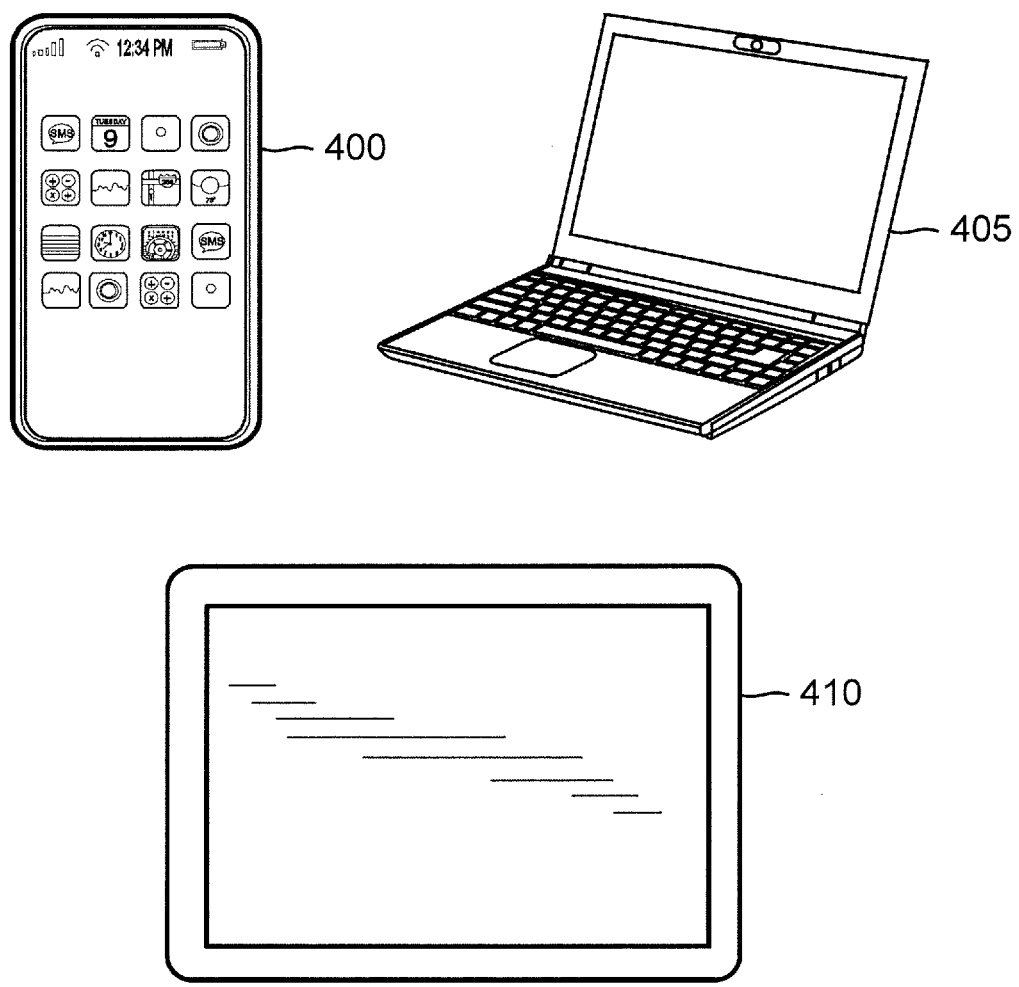
FIG. 4 illustrates a plurality of electronic systems incorporating an electronically programmable memory in accordance with embodiments disclosed herein.

Electrically programmable memory 200 has numerous applications. For example, it conventional to use such a memory to configure a system-on-a-chip (SOC) with configuration data, trim data, RAM redundancy information, an encryption code, or other suitable information. FIG. 4 illustrates some exemplary devices that include an SOC enhanced with electrically programmable memory 200. In particular, a cell phone 400, a laptop 405, and a tablet PC 410 may all include an electrically programmable memory 200 constructed in accordance with the disclosure. Other exemplary electronic systems such as a music player, a video player, a communication device, and a personal computer may also be configured with electrically programmable memories in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit, comprising:
 a thin-oxide PMOS transistor having a source and a switched n-well;
 a native thick-oxide NMOS transistor having a gate controlled responsive to a control signal, a drain coupled to a low-voltage supply configured to provide a low voltage, and a source coupled to the thin-oxide PMOS transistor's source and switched n-well; and
 a thick-oxide PMOS transistor having a gate controlled responsive to the control signal, a source coupled to a high-voltage supply configured to provide a high voltage that is greater than the low voltage, and a drain coupled to the thin-oxide PMOS transistor's source and switched n-well, wherein the native thick-oxide NMOS transistor and the thick-oxide PMOS transistor each have a first gate-oxide thickness that is greater than a second gate-oxide thickness for the thin-oxide PMOS transistor.

2. The circuit of claim 1, further comprising an inverter configured to invert the control signal into an inverted control signal, and wherein the gate for the native thick-oxide NMOS transistor and the gate for the thick-oxide PMOS transistor are configured to be driven by the inverted control signal.

3. The circuit of claim 2, wherein the thick-oxide PMOS transistor includes an un-switched n-well permanently coupled to the high-voltage supply.

4. The circuit of claim 3, wherein the thick-oxide PMOS transistor has a first size and wherein the thin-oxide PMOS transistor has a second size smaller than the first size.

5. The circuit of claim 4, wherein the first size and the first gate-oxide thickness each have a magnitude sufficient to protect the thick-oxide PMOS transistor from its un-switched n-well being permanently coupled to the high-voltage supply.

6. The circuit of claim 4, wherein the second size and the second gate-oxide thickness each have a magnitude that is not sufficient to protect the thin-oxide PMOS transistor from a permanent tie of the high-voltage supply to the switched n-well.

7. The circuit of claim 1, further comprising:
 a memory, wherein the thin-oxide PMOS transistor is a word line driver transistor for the memory.

8. The circuit of claim 7, wherein the memory is an electrical programmable memory further comprising an e-fuse having a terminal coupled to a drain of a thin gate-oxide programming NMOS transistor, the thin gate-oxide programming NMOS transistor having its gate coupled to a word line, the word line being coupled to a drain for the word line driver PMOS transistor.

9. The circuit of claim 8, further comprising a bit line coupled to an opposing terminal of the e-fuse.

10. The circuit of claim 9, further comprising a high power switch for biasing the bit line to the high voltage during a programming mode for the e-fuse.

11. The memory of claim 10, wherein the high power switch includes a global power switch and a local power switch in series between the bit line and a high voltage supply configured to supply the high voltage.

12. A method, comprising:
 responsive to receiving a control signal in a first state at an n-well voltage switching circuit, biasing both a source and a switched n-well of a thin-oxide PMOS transistor with a first voltage, wherein the n-well voltage switching circuit comprises transistors of a first size and a first gate-oxide thickness, and wherein the thin-oxide PMOS transistor has a second size that is less than the first size and a second gate-oxide thickness that is less than the first gate-oxide thickness, and
 responsive to receiving the control signal in a second state at the n-well voltage switching circuit, biasing the switched n-well with a second voltage that is less than the first voltage.

13. The method of claim 12, wherein the second gate-oxide thickness is not sufficient to prevent the thin-oxide PMOS transistor from damage from a permanent bias of the switched n-well to the first voltage, the method further comprising controlling a duration for the receipt of the control signal in the first state such that the thin-oxide PMOS transistor is not damaged by the bias of its switched n-well with the first voltage.

14. The method of claim 12 wherein the thin-oxide PMOS transistor is a word line driver transistor for an electrically programmable memory, and wherein biasing the switched n-well with the first voltage comprises programming an e-fuse through the word line driver transistor.

15. The method of claim 14, wherein biasing the switched n-well with the second voltage comprises reading a state of the e-fuse.

16. The method of claim 14, further comprising biasing a bit line coupled to the e-fuse to the high voltage during the programming of the e-fuse, wherein biasing the bit line comprises biasing the bit line through a local power switch PMOS transistor having a switched n-well biased by the n-well voltage switching circuit to the second voltage.

* * * * *